United States Patent [19]

Tanbakuchi

[11] Patent Number: 4,817,200
[45] Date of Patent: Mar. 28, 1989

[54] TRACKING YIG TUNED FILTER-MIXER

[75] Inventor: Hassan Tanbakuchi, Rohnert Park, Calif.

[73] Assignee: Hewlett-Packard Company, Palo Alto, Calif.

[21] Appl. No.: 19,147

[22] Filed: Feb. 26, 1987

[51] Int. Cl.⁴ .............................................. H04B 1/26
[52] U.S. Cl. .................... 455/323; 455/197; 455/337
[58] Field of Search ............... 455/197, 337, 343, 323, 455/169; 332/51 R; 333/1.1, 24.1, 117; 379/160

[56] References Cited

U.S. PATENT DOCUMENTS

| | | | |
|---|---|---|---|
| 3,364,430 | 1/1968 | Goodman et al. | 455/323 |
| 3,435,346 | 3/1969 | Allen et al. | 455/197 |
| 3,839,677 | 10/1974 | Sedin | 455/323 |
| 3,973,204 | 8/1976 | Keiter | 455/197 |
| 4,059,803 | 11/1977 | Mikhailovsky | 455/323 |
| 4,169,253 | 9/1979 | Cohen | 455/197 |

Primary Examiner—Robert L. Griffin
Assistant Examiner—Curtis Kuntz
Attorney, Agent, or Firm—James M. Williams; William C. Milks, III

[57] ABSTRACT

A tracking YIG tuned filter-mixer circuit is provided. In the preferred embodiment, four YIG-tuned resonators are combined to provide a tracking filter-mixer with a switched input. Field coils produce a magnetic tuning field that is uniform over the four YIG resonators. The first YIG resonator acts as the first stage of the filter, and in combination with a PIN diode circuit switches the RF input signal either to an output port or into the succeeding stages of the filter mixer. The second YIG resonator acts as the second stage of the filter. The third YIG resonator acts as the third stage of the filter, and as a fundamental mixer for combining the input RF signal with a swept LO signal to produce the IF output signal. The fourth YIG resonator acts as a discriminator, comparing the LO frequency to the filter tuning frequency to generate an error signal for the field coil drive circuit. A small magnetic field coil over the fourth YIG resonator produces an offset magnetic field, tuning the fourth YIG resonator to the swept LO frequency, above the other three resonators by the IF frequency, so that the three YIG resonators that comprises the filter stages track the LO but are tuned to the RF frequency.

25 Claims, 7 Drawing Sheets

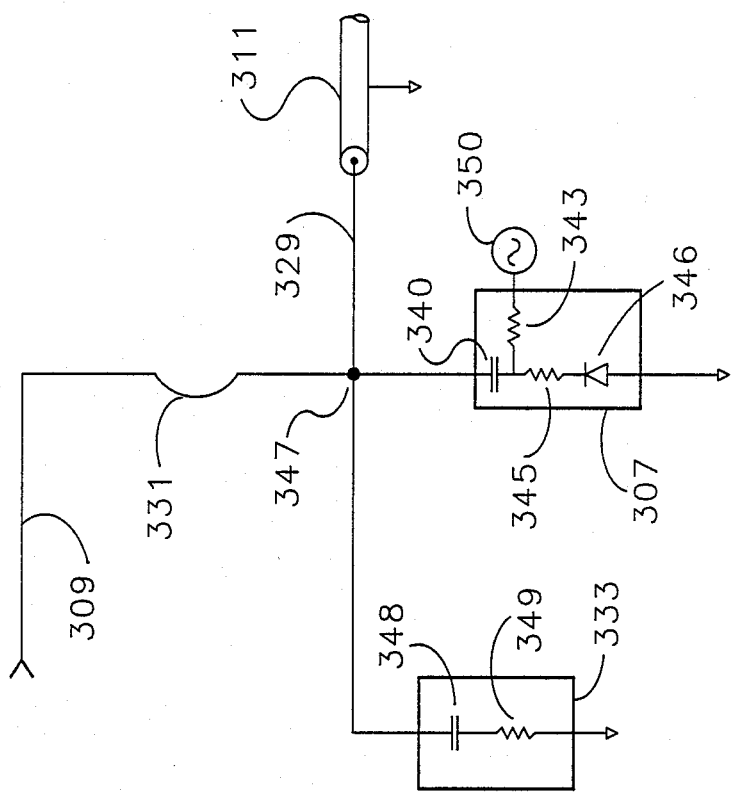

TRACKING YIG TUNED FILTER-MIXER

BACKGROUND AND SUMMARY OF THE INVENTION

The invention relates to a tracking YIG-tuned filter and mixer, particularly adaptable for use as a preselector in a spectrum analyzer.

A spectrum analyzer is a scanning receiver that displays a plot of signals and their bandwidths over a specific frequency band. To cover a broad frequency range, e.g., DC to 22 GHz, the input signal is divided into high frequency and low frequency portions. The invention is concerned with the initial processing of the high frequency portion and with switching the input signal between the high and low frequency sections of the instrument.

FIG. 1 shows a schematic diagram illustrating the initial signal processing in a conventional spectrum analyzer. A radio frequency (RF) input signal at terminal 11 is coupled through a mechanically actuated microwave relay switch 13 to the low frequency signal processing section on line 15 or to the high frequency signal processing section on line 17. Low frequency band signals, with a frequency under 3 GHz, are applied to the low frequency analysis circuits. Microwave band signals, with a frequency between 2.7 and 22 GHz are passed through a tunable bandpass filter 19, then downconverted by harmonic mixer 21. Harmonic mixer 21 combines the RF input signal with a signal from a local oscillator (LO) or a harmonic of the signal from the LO to produce an intermediate frequency (IF) signal at a frequency suitable for processing by the spectrum analyzer. A spectrum analysis measurement is performed on the RF input signal by sweeping the LO frequency over the frequency range of interest while a set IF frequency is monitored.

The graph in FIG. 2 illustrates the result of the downconversion by mixer 21, showing the relationship between the LO, RF and IF frequencies. In FIG. 2, the vertical axis represents signal power and the horizontal axis represents signal frequency. IF signal 25 has a frequency equal to the difference between the LO signal (or harmonic) 29 and RF signal 27, so that the RF signal is measured by monitoring a set IF frequency, below the LO frequency, at $f_{RF}=(n)f_{LO}-f_{IF}$. However, an image RF signal above the LO frequency, at $f'_{RF}=(n)f_{LO}+f_{IF}$, will also produce a signal at the monitored IF frequency. To resolve this ambiguity, filter 19 acts as a tunable bandpass filter over a frequency range including $f_{RF}$, as shown by the broken line curve 24, thereby attenuating any image signal 31 at $f'_{RF}$. Thus, the passband of filter 19 must track the sweeping LO signal, with the center frequency of the passband separated from the LO frequency (or harmonic) by the IF frequency.

The prior art circuit shown in FIG. 1 has several drawbacks. Mechanically actuated microwave relay switches are slow and become unreliable with long term use. Accurate tunable high frequency filters are difficult to build.

Some contemporary YIG-tuned structures use PIN diode switches. The PIN diode switches solve many of the problems caused by the mechanical switches, but to date these circuits have been limited to operation above 10 MHz.

Yig tuned resonator filters comprise a YIG sphere suspended between two orthogonal half loop conductors. The YIG material exhibits ferrimagnetic resonance. In the presence of an external DC magnetic field, the dipoles in the YIG sphere align with the magnetic field, producing a strong net magnetization M. An RF signal applied to the input half loop produces an alternating magnetic field perpendicular to the DC magnetic field. The dipoles precess around the applied DC magnetic field at the frequency of the RF signal if the RF frequency is close to the resonance frequency of the dipoles. The resonance frequency for a spherical YIG resonator is:

$$f_r = \gamma (H_o \pm H_a)$$

where, $H_o$ is the strength of the applied DC field in oersteds, $H_a$ is the internal anisotropy field within the YIG material, and $\gamma$ is the gyromagnetic ratio (2.8 MHz/oersted).

If an RF signal at or near $f_r$ is applied to the input loop, the precessing dipoles create a circularly polarized magnetic field, rotating at the RF frequency, in a plane perpendicular to the externally applied magnetic field. This rotating field couples to the other conductor loop, inducing an RF signal in the loop that, at the resonance frequency $f_r$, is phase shifted 90 degrees from the input RF signal.

Because the resonance bandwidth can be made fairly narrow, the YIG resonator makes an excellent filter at RF frequencies, tunable by varying the strength of the applied DC magnetic field.

However, it has been difficult to achieve accurate tuning in YIG-tuned filters because of the nonlinearity, hysteresis and eddy current delay in the magnetic tuning elements. If the peak of the filter passband is not centered at the RF frequency being measured, the amplitude of the measured signal is attenuated, as shown by broken line curve 24', making the measurement inaccurate.

One approach to maintaining the YIG filter at the proper tracking frequency, known as peaking the filter, involves dithering the magnetic tuning field while peak detecting the resulting IF output signal. Although this method can be effective in eliminating amplitude inaccuracy, it is time consuming.

A second approach involves adding an extra YIG filter detector in a small offsetting magnetic field. By sending a known signal to this detector and dithering the offset field, the magnetic structure can be tuned. This method, however, has a severe drawback. The dithering offset field can leak to the other YIG tuned resonators nearby, adding spurious signals to the RF signals coupled through the YIGs.

SUMMARY OF THE INVENTION

In accordance with the preferred embodiment of the present invention, four YIG-tuned resonators are combined to provide a tracking filter-mixer with a switched input. Magnetic field coils produce a magnetic tuning field that is uniform over the four YIG resonators. The first YIG resonator acts as the first stage of the filter, and in combination with a PIN diode circuit switches the RF input signal either to the low frequency analyzer section or to the succeeding stages of the filter-mixer. The second YIG resonator acts as the second stage of the filter. The third YIG resonator acts as the third stage of the filter, and as a fundamental mixer for combining the RF input signal with a swept LO signal to produce the IF output signal. The fourth YIG resonator acts as a discriminator, comparing the LO frequency to the filter tuning frequency to generate an error signal for the magnet coil drive circuit. A small magnetic coil over the fourth YIG resonator produces an offset magnetic field tuning the fourth YIG resonator to the swept LO frequency, above the other three resonators by the IF frequency, so that the three YIG resonators that comprise the filter stages track the LO but are tuned to the RF frequency.

BRIEF DESCRIPTION OF THE DRAWINGS

FIGS. 4A, 4B and 4C are equivalent circuits of part of the device shown in FIG. 3.

DESCRIPTION OF THE PREFERRED EMBODIMENT

Figure 1:
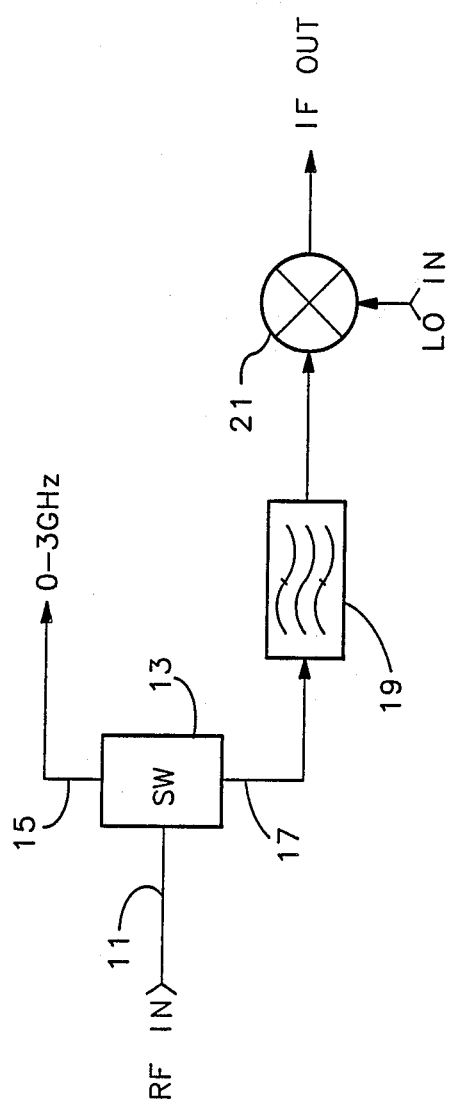
FIG. 1 shows a prior art circuit used in a spectrum analyzer preselector section.
Figure 2:
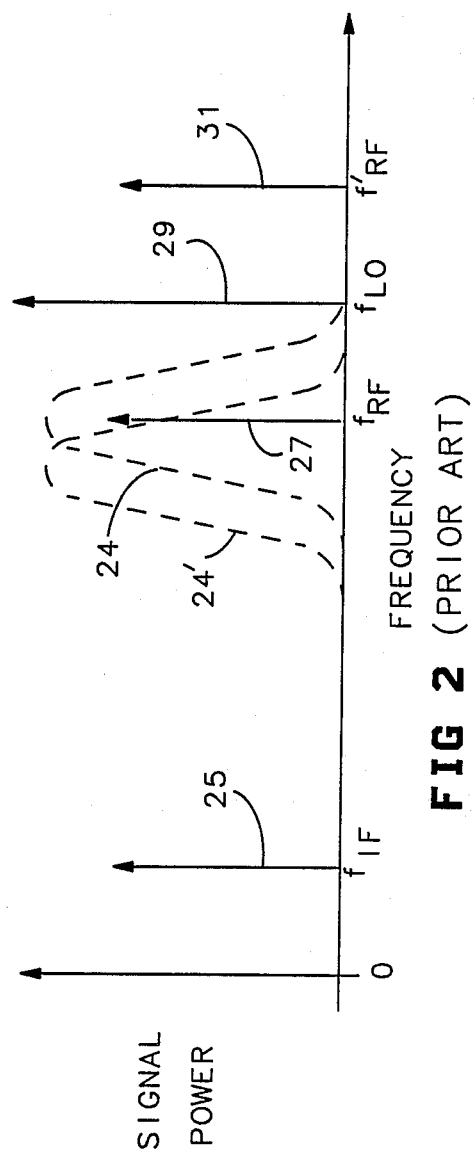
FIG. 2 is a graph illustrating the relationship of the RF, LO and IF signals in the prior art circuit shown in FIG. 1.
Figure 3:
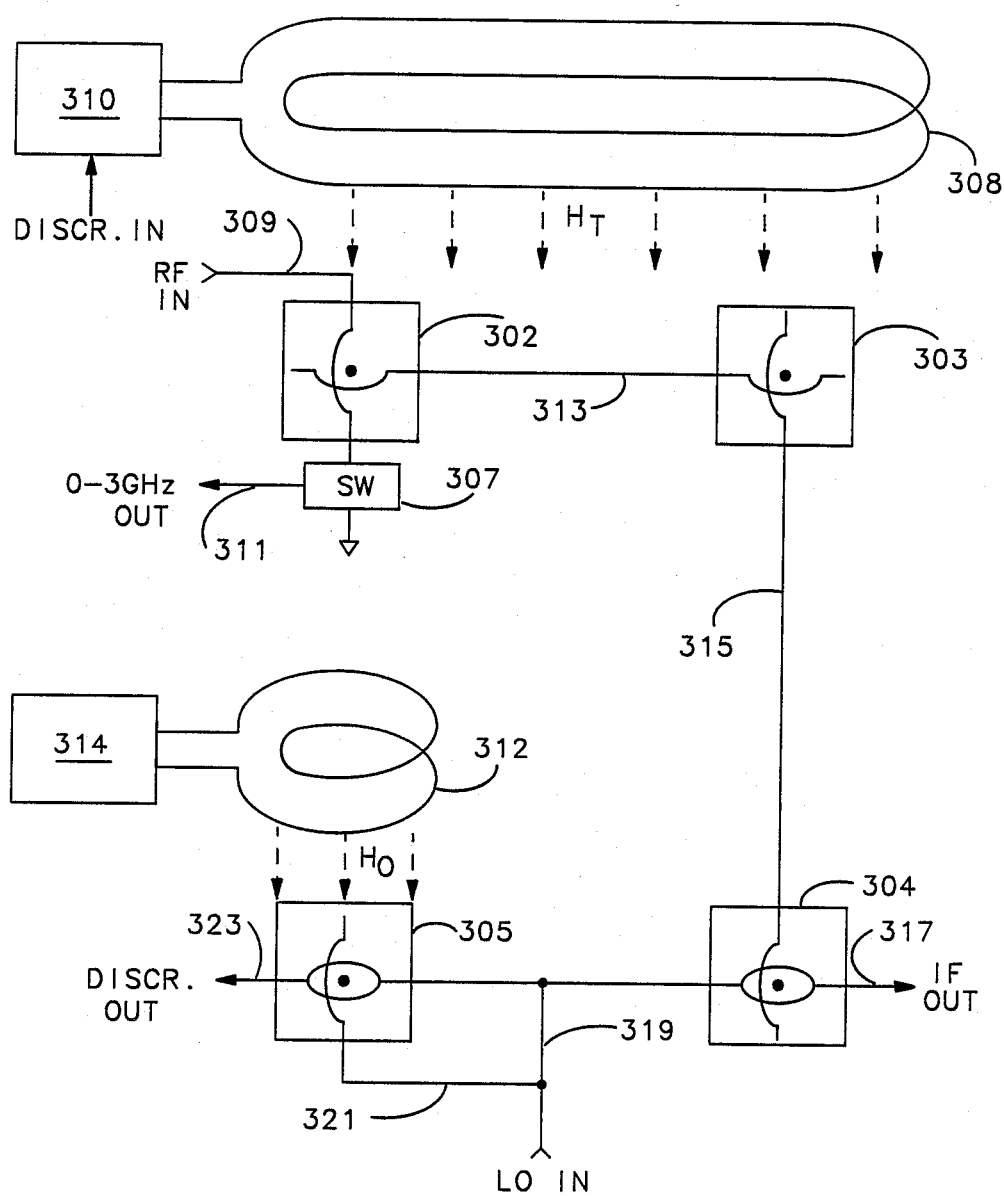
FIG. 3 shows a schematic block diagram of a tracking YIG-tuned filter-mixer circuit constructed in accordance with the preferred embodiment of the present invention.

The preferred embodiment of the invention is a preselector circuit for a spectrum analyzer. FIG. 3 shows a schematic diagram of a tracking preselector using four YIG sphere resonators, 302, 303, 304 and 305. All four YIG resonators are tuned by a magnetic field $H_T$, generated by field coils 308, which are energized by control circuit 310. YIG resonator 305, which acts as a discriminator, is also within a second offsetting magnetic field, $H_O$, generated by smaller field coils 312, which are energized by control circuit 314.

Two of the YIG resonators, 302 and 303, have two orthogonal half loops around the YIG sphere, an input loop and an output loop. The other two YIG resonators, 304 and 305, have one half loop for input and one full loop for output mounted orthogonally around the YIG sphere. In the absence of a magnetic field, there is negligible electromagnetic coupling between the input and output loops of the YIG resonators. However, with a magnetic field present, signals can be coupled from the input loop to the output loop through the YIG sphere. Only those signals at or near the resonance frequency, determined by the strength of the magnetic field $H_T$, will be coupled to the output loop, so the YIG resonator works well as a tunable bandpass filter.

YIG resonator 302 acts in combination with switch 307 to switch the input RF signals on coaxial line 309 onto low frequency output line 311 or into the YIG filter mixer network on line 313. Switch 307 is turned off for input signals below about 3 GHz, and the signals are directed to output line 311. Switch 307 is turned on for input signals above about 3 GHz, so the output side of the half loop in resonator 302 is grounded, and the input signals are coupled through the YIG sphere to line 313.

YIG resonator 302 is also the first stage of a three stage passband filter, comprising the three YIG resonators 302, 303 and 304. The center frequency of the passband filter is tuned by sweeping the magnetic field $H_T$ to track the sweeping LO frequency. YIG resonator 303 is the second stage of the filter, tuned to the same frequency as YIG resonator 302 by the field $H_T$.

YIG resonator 304 has a dual function, as the third stage of the filter and also as a fundamental mixer, combining the filtered RF input signal on line 315 with the LO signal on line 319 to yield the IF output signal on line 317.

Finally, YIG resonator 305 functions as a discriminator, sensing any difference between the LO frequency and the resonance frequency of the YIG sphere tuned by the magnetic field. The LO signal transmitted through the full loop from line 319 is compared with the LO signal from line 321 coupled through the YIG sphere to the full loop to provide an error signal output via line 323 for the magnetic coil control circuit 310. A supplemental magnetic coil 312 over YIG resonator 305 provides the offset magnetic field $H_O$, so that the tuning field $H_T$ is actually offset from the LO frequency by the IF frequency, and the three stage YIG filter is tuned to the RF frequency.

The four YIG resonators in combination perform the multiple functions required for the preselector. By tuning the magnetic field, the passband center frequency of the filter tracks the LO frequency. The offset magnetic field, $H_O$, over the discriminator determines the offset of the passband center frequency with respect to the LO frequency. The accuracy of the offset is dynamically checked and adjusted by the discriminator, peaking the filter without creating any spurious magnetic fields. The mixer YIG resonator 304 combines the RF and LO signals to produce the IF output signal.

In addition, the switch and filter circuits included in the preselector of the invention perform different functions as their frequency dependent impedance changes over the broad frequency range of the spectrum analyzer, to separate the low and high frequency input bands and to isolate the RF, LO and IF signal paths.

SWITCH OPERATION

The input signal for a spectrum analyzer can range from DC to 22 GHz or higher. To handle this wide range, the input signal is divided into a low frequency band, e.g., from DC to 3 GHz, and a high frequency band, e.g., from 2.7 GHz to 22 GHz. The low frequency band is coupled directly to the spectrum analyzer circuits. The high frequency band must be downconverted before it is applied to the spectrum analyzer circuits.

The high frequency and low frequency bands are separated at YIG resonator 302, by the operation of a pin diode switch circuit 307. FIG. 4A shows a more detailed schematic diagram of the PIN diode switch circuit 307. A coaxial input line 309 is connected to one side of half-loop 331. The other side of half-loop 331, node 347, is connected by a microstrip transmission line 329 to coaxial output line 311, through an RF matching network 333 to ground, and through switch circuit 307 to ground. In analyzing the circuit's behavior for high frequency signals, the physical connections to the pin diode switch must be treated as transmission lines, and the frequency dependent impedance of any signal path must be taken into consideration.

For low frequency spectrum analysis, the RF input signal must be directed to coaxial output line 311, which feeds the low frequency signal processing section of the spectrum analyzer. To do this, the pin diode 346 is biased off, so it presents a high impedance path. The capacitor in matching network 333 also presents a high impedance path to ground for the low frequency signals. In addition, capacitor 348 in matching network 333 in combination with the inductance of output line 329 and half-loop 331 produces a low pass filter, so the low frequency signals pass through half-loop 331 and out through the output coaxial line 311 with minimal losses.

Voltage source 350, connected through resistors 343 and 345 to pin diode 346, provides DC bias for pin diode 346. Capacitor 340 blocks any DC bias voltage from appearing at node 347. Capacitor 340 physically separates PIN diode 346 from node 347, and thus allows the PIN diode 346 to be biased off without introducing the bias voltage onto the input line 309 HT or output line 311. Thus switch circuit 307 operates effectively at frequencies down to DC.

For high frequency spectrum analysis, the RF input signal must be coupled through the YIG sphere onto line 313. To maximize the coupling through the YIG sphere, it is important to have a good RF ground at the output side of half-loop 331. To accomplish this, pin diode 346 is biased on, so it presents a low impedance path to ground. As the frequency increases, the impedance of the transmission line to the pin diode increases. Above about 10 GHz, the RF matching network 333 provides the low impedance path from node 347 to ground.

Figure 4B:
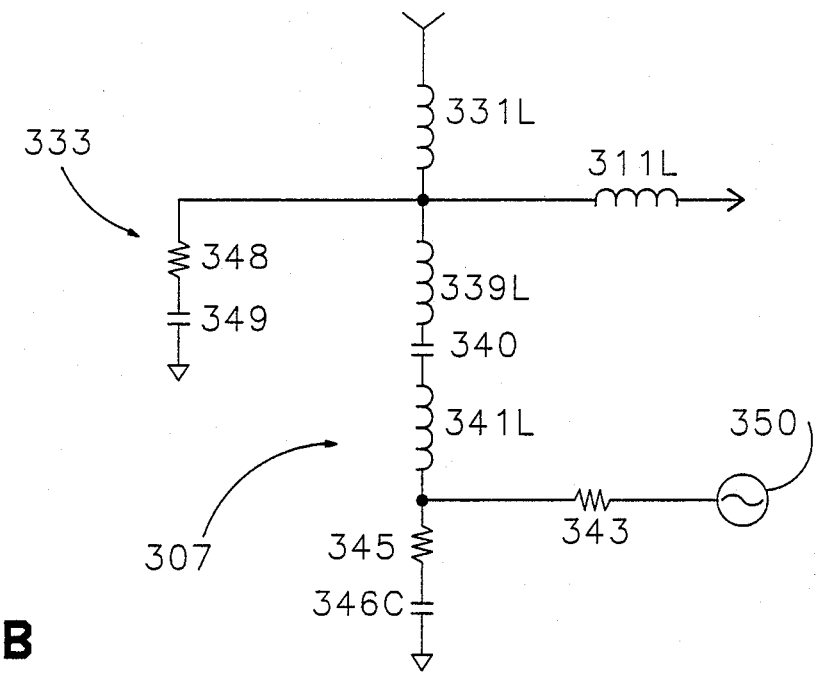
Figure 4C:
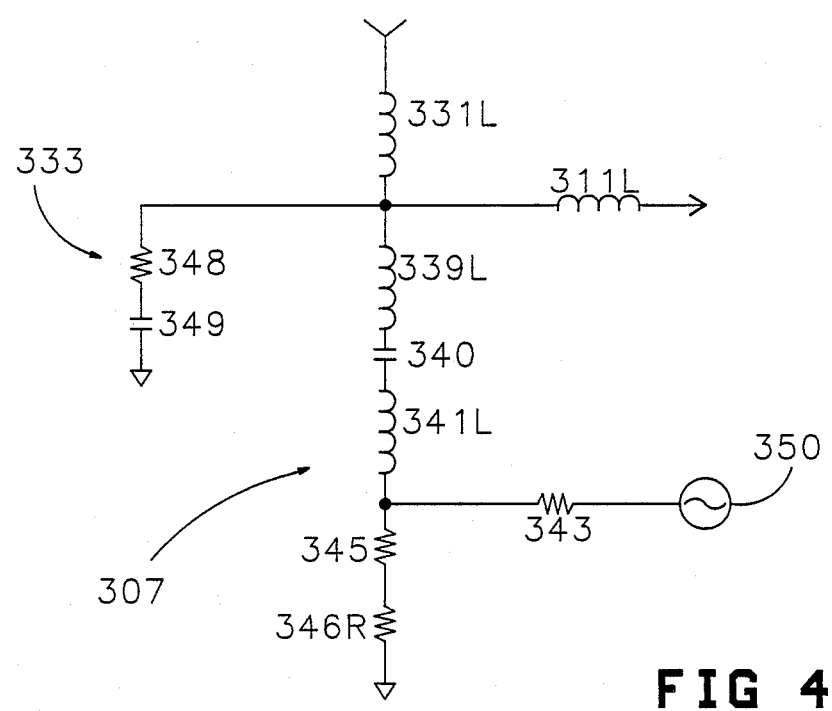

The equivalent circuits for half-loop 331, RF matching network 333 and PIN diode switch circuit 307 are shown in FIGS. 4B and 4C. In analyzing the behavior of circuit 307 for high frequencies, the physical connections between circuit elements must be treated as transmission lines.

When the pin diode is biased off, the equivalent circuit is as shown in FIG. 4B, with the pin diode providing capacitance 346C, about 0.06 pf. Capacitor 340 has a value of 8–10 pf, and blocks the DC bias from reaching node 347. Inductance 331L is the equivalent inductance of half-loop 331; inductances 339L and 341L are the equivalent inductances of the connections from half-loop 331 to capacitor 340 and from capacitor 340 to pin diode 346; and inductance 311L is the equivalent inductance of microstrip line 329. The PIN diode off capacitance 346C, in combination with capacitor 340 and the transmission line inductances 339L and 341L, produce a very high impedance at node 347 for frequencies up to 3 GHz.

When the pin diode is biased on, the equivalent circuit is as shown in FIG. 4C, with the pin diode providing a resistance 346R, about 2 ohms. In order to maximize the amount of energy coupled to the YIG sphere, the total impedance from half-loop 331 to ground must be minimized. However, when the frequency of the RF input signal increases above approximately 16 GHz, the impedance at node 347 produced by the path through the PIN diode 346 to ground increases markedly. Therefore, in order to minimize the impedance at node 347 for higher frequencies, matching network 333 provides a low impedance path to ground for RF signals at frequencies above 10 GHz.

Resistor 345, about 10 ohms, provides additional switching efficiency in the 3–10 GHz range. This resistor will "de-Q" any parallel resonance between the load connected to the output line 311 and capacitor 340 when the RF input signal is grounded through the pin diode 346. Similarly, in the range above 10 GHz, resistor 348 will "de-Q" any parallel resonance between the load connected to the output line 311 and RF matching network 333 when the RF input signal is grounded through network 333.

MIXER OPERATION

RF signals in the range of 2.7 GHz to 22 GHz which are within the passband selected by the tuning magnetic field $H_T$ are coupled through YIG resonator 302. The signals pass to the second stage filter, YIG resonator 303, on line 313, then to the third stage filter and mixer, YIG resonator 304, on line 315. Using three filter stages improves the selectivity of the filter.

Figure 5:
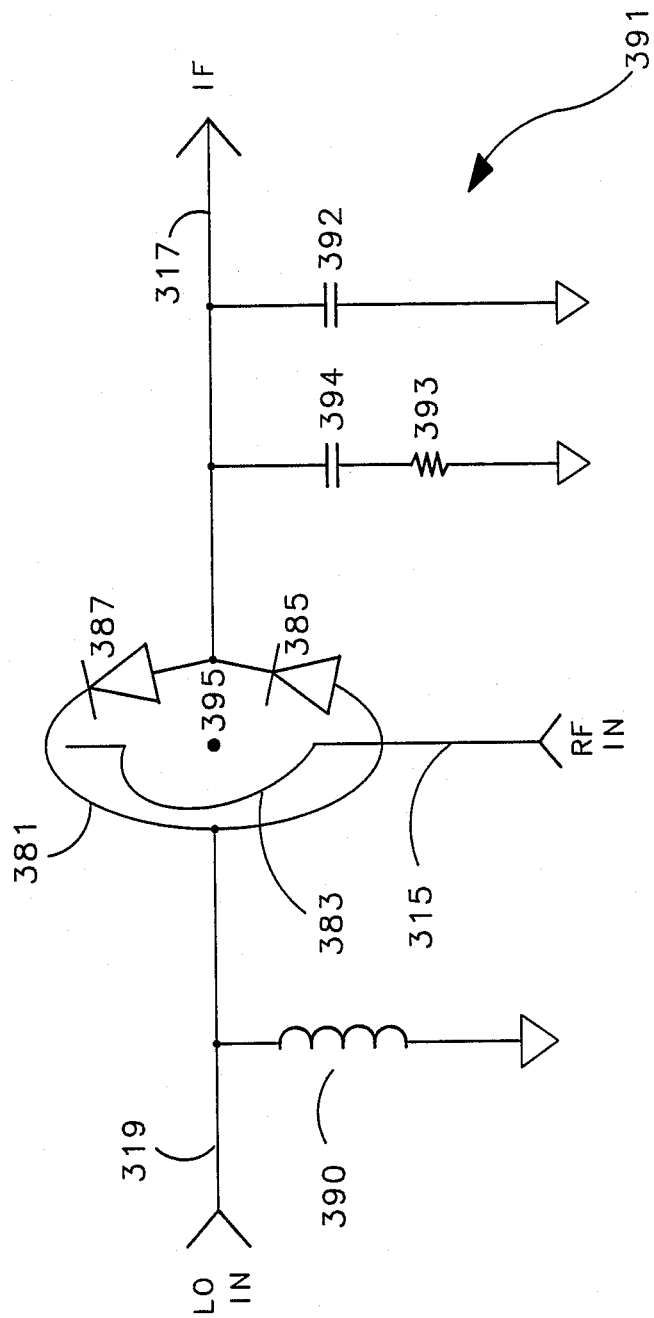
FIG. 5 is a more detailed schematic circuit diagram of resonator 304 shown in FIG. 3.

YIG resonator 304 and its associated circuitry function to mix the filtered RF signals which appear on line 315 with the local oscillator (LO) signals on line 319. FIG. 5 is a more detailed schematic circuit diagram of resonator 304.

YIG resonator 304 operates as the third stage RF filter and as a mixer, downconverting the RF signal by combining the RF input signal with the LO signal to produce a lower frequency IF output signal. This downconversion is accomplished using well known diode mixing techniques. Resonator 304 comprises a YIG sphere with a full loop 381 and a half loop 383. The input of the half loop 383 is connected to line 315 which carries the filtered RF signal. The input of full loop 381 is connected to line 319 which carries the LO signal. Two diodes, 385 and 387 are connected in series across the output side of full loop 381, and output line 317 is connected to the junction point between the diodes. A matching network 391 is connected to line 317 near the junction point between the diodes.

The RF signal is coupled through the YIG sphere to full loop 381 that carries the LO signal. The combined signals are applied to series diode pair 385 and 387 to produce the IF signal on a coaxial output line 317.

The LO signal is applied to the full loop 381 via input line 319. Inductor 390 appears as a high impedance to the high frequency LO signal. The LO signal is split between the upper and lower portions of the full loop 381, and alternately biases diode 385 or 387 into a conducting state. Matching network 391 provides a low impedance path to ground for the LO signal, so that the LO signal produces a high conductance state in diodes 385 and 387 to insure good mixer operation. Resistor 393, about 10 ohms, acts with capacitor 394, about 1 pf, to "de-Q" any parallel resonance between the IF circuits connected to line 317 and capacitor 392 over the LO frequency range, to keep the impedance at node 395 low. The low impedance path to ground through network 391 also minimizes the leakage of the LO signal over the output line 317. To minimize parasitic inductance, and thus minimize the impedance at node 395, network 391 is integrated with diodes 385 and 387 on a microwave monolithic integrated circuit.

The filtered RF signal applied to the half loop 383 is coupled through the YIG sphere to the full loop 381, inducing a balanced circular current in loop 381. The LO input point on loop 381 is a virtual RF ground, because the current is balanced, so there is no tendency for the RF signal to pass down the LO input line 319. At the opposite side of loop 381, the LO signal will gate the RF signal alternately through the two diodes 385 and 387, and the IF output line 317 will receive no net RF current.

The two diodes 385 and 387 produce the IF signal current which is coupled to the IF load of the spectrum analyzer over a coaxial output line attached to line 317. The return current path for the IF signal is provided through the shield of the coaxial line to the ground plane of resonator 304, then through inductor 390. Although the network 391 is a ground path for the LO signal, to the lower frequency IF signal network 391 appears as a high impedance. Thus the IF signal flows out the coaxial output line 317 to the spectrum analyzer with minimum loss.

DISCRIMINATOR OPERATION

YIG resonator 305 operates as a discriminator, producing an error signal when the resonator is not tuned to the LO frequency. This is done by splitting the LO signal, coupling one portion of the LO signal through the YIG resonator, and recombining the coupled signal with the second portion of the split signal to produce an output. Because the magnitude and more importantly the phase shift of the portion of the LO signal coupled through the resonator varies from 90 degrees if the LO signal is not at the resonance frequency, the magnitude and phase difference between the split LO signals will vary if the LO signal is not at the tuned resonance frequency of resonator 305. The resulting output is the characteristic output curve of a phase discriminator. This output is used as an error feedback signal to the drive circuit for the magnetic tuning coil of the device.

Figure 6:
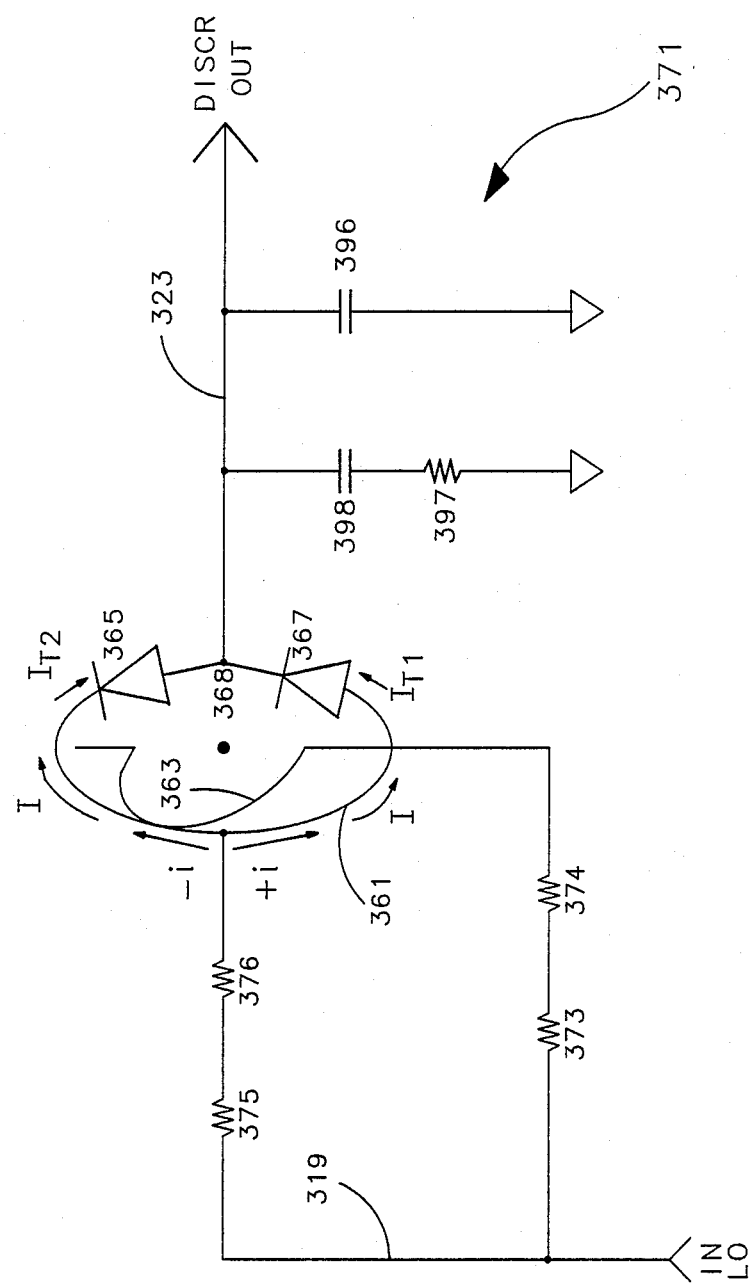
FIG. 6 is a more detailed schematic circuit diagram of resonator 305 shown in FIG. 3.

FIG. 6 is a more detailed schematic circuit diagram of resonator 305. Resonator 305 includes a full loop 361 and a half loop 363. The LO signal is split by a divider network comprised of resistors 373, 374, 375 and 376 and applied to the full loop 361 via line 319 and to the half loop 363 via line 321. Two diodes, 365 and 367 are connected in series across the output side of full loop 361, and output line 323 is connected between the diodes. Also connected to the junction point between the diodes is a matching network 371.

The LO signal covers a multi-octave bandwidth, and the discriminator must also operate over a multi-octave bandwidth, with the two portions of the LO signal arriving in phase at the full loop 361 and at the half loop 363. To achieve this, it is important to make the resistor divider network physically small, with the values and physical placement of the resistors precisely controlled.

The portion of the LO signal applied to the full loop 361 over line 319 produces current I incident on diodes 365 and 367. The other portion of the LO signal, coupled from half loop 363 through the YIG sphere to full loop 361 if the LO frequency is at or near the resonance frequency, induces circulating current i incident on diodes 365 and 367. Thus diode 367 receives current $I_{T1}$, the phasor sum of currents I and i, to produce a positive voltage $V_{T1}$ at node 368. And diode 365 receives current $I_{T2}$, the phasor sum of currents I and $-i$, to produce a negative voltage $V_{T2}$ at node 368. The discriminator output voltage $V_{OUT}$ is the algebraic sum of voltages $V_{T1}$ and $V_{T2}$.

Matching network 371 provides a low impedance path to ground for the LO signal, so that the LO signal produces a high conductance state in diodes 365 and 367 to insure good mixer operation. Resistor 397, about 10 ohms, acts with capacitor 398, about 1 pf, to "de-Q" any parallel resonance between the circuits connected to line 323 and capacitor 396 over the LO frequency range, to keep the impedance at node 368 low. The low impedance path to ground through network 371 also minimizes the leakage of the LO signal over the output line 323. To minimize parasitic inductance, and thus minimize the impedance at node 368, network 371 is integrated with diodes 365 and 367 on a microwave monolithic integrated circuit.

Figure 7A:
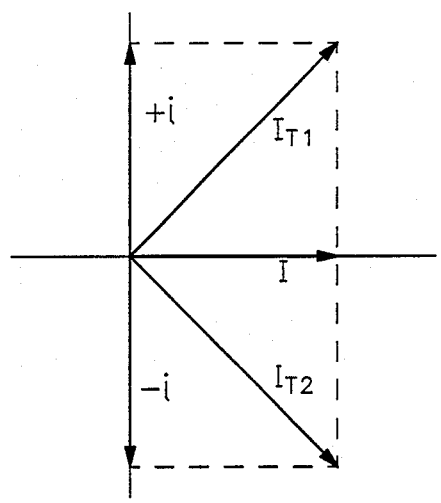
FIGS. 7A, 7B and 7C are phasor diagrams illustrating the operation of resonator 305 as a phase discriminator.
Figure 7B:
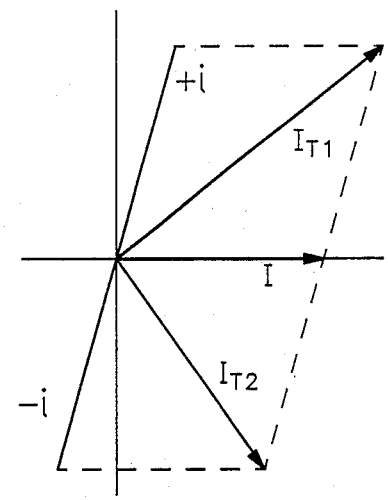
Figure 7C:
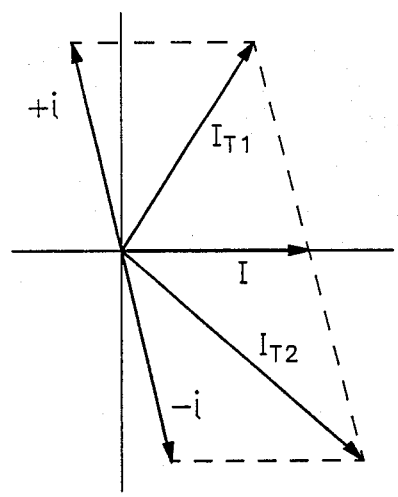

The operation of resonator 305 as a discriminator is illustrated by the phasor diagrams of FIGS. 7A, 7B and 7C. FIG. 7A shows the phasor relationships when the LO is at the resonance frequency of the YIG resonator 305. At resonance I and i are exactly 90 degrees out of phase, so that $I_{T1}$ and $I_{T2}$, and therefore $V_{T1}$ and $V_{T2}$, are equal in magnitude. Thus $V_{OUT}$ is zero. FIG. 7B shows the phasor relationships when the LO is below the resonance frequency of the YIG resonator 305. Below resonance $+i$ is less than 90 degrees ahead of I and $-i$ is more than 90 degrees behind I, so that $I_{T1}$ is greater in magnitude than $I_{T2}$. Thus $V_{T1}$ is greater than $V_{T2}$ and $V_{OUT}$ is positive. FIG. 7C shows the phasor relationships when the LO is above the resonance frequency of the YIG resonator 305. Above resonance $+i$ is more than 90 degrees ahead of I and $-i$ is less than 90 degrees behind I, so that $I_{T1}$ is smaller in magnitude than $I_{T2}$. Thus $V_{T1}$ is smaller than $V_{T2}$ and $V_{OUT}$ is negative.

Figure 8:
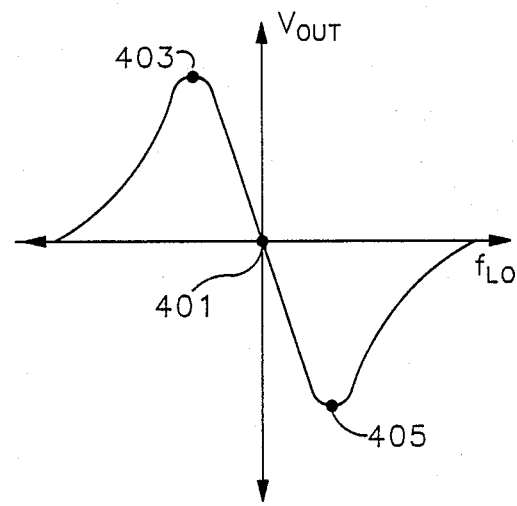
FIG. 8 is a graph of the discriminator output signal from resonator 305.

FIG. 8 shows a plot of $V_{OUT}$ verses the frequency of the LO signal, with the origin set at the resonance frequency of the YIG resonator 305. It can be seen from FIG. 8 that, between points 403 and 405, $V_{OUT}$ varies directly as the difference between the LO frequency and the resonance frequency to which YIG resonator 305 is tuned. Thus $V_{OUT}$ is positive below point 401 where the tuned YIG resonance frequency is above the LO frequency, $V_{OUT}$ is zero at point 401 where the LO frequency equals the tuned YIG resonance frequency, and $V_{OUT}$ is negative above point 401 where the tuned YIG resonance frequency is below the LO frequency.

Because of this relationship, the discriminator output $V_{OUT}$ is used as a feedback signal to control circuit 310 to set the magnetic field $H_T$ on the YIG resonators, thereby varying their resonant frequency to accurately track the LO frequency.

The discriminator of the invention is not limited to the tracking filter-mixer application of the preferred embodiment. It can also be applied to a variety of YIG tuned structures, for example, a tracking filter with single or multiple stage YIG tuned resonators without a mixer stage.

I claim:

1. A method of tracking a ferrimagnetic tuned resonator circuit with respect to a given reference signal to provide accurate and repeatable center frequency positioning of the ferrimagnetic tuned resonator circuit, the ferrimagnetic tuned resonator circuit comprising at least one ferrimagnetic resonator, the tracking being achieved using a discriminator also comprising a ferrimagnetic resonator, comprising the steps of:
  applying a uniform magnetic tuning field $H_T$ to both the ferrimagnetic resonator in the ferrimagnetic tuned resonator circuit and to the ferrimagnetic resonator in the discriminator;
  producing the reference signal at a frequency to which the discriminator resonator is to be tuned and dividing the reference signal into a first portion and a second portion;
  applying the reference signal to the discriminator, with the first portion coupled through the discriminator via a conductor, and the second portion coupled through the discriminator via a ferrimagnetic body in the discriminator resonator, so that the phase of the second portion of the reference signal is shifted with respect to the phase of the first portion in proportion to the difference between the frequency of the reference signal and the tuned resonant frequency of the discriminator resonator;
combining the first portion with the phase shifted second portion to produce an error signal; and
applying the error signal as a feedback signal to adjust the magnetic tuning field $H_T$ to correct the center frequency positioning of the ferrimagnetic tuned resonator circuit.

2. The method of claim 1 wherein dividing the reference signal is done with a resistor divider network configured so that the portions of the reference signal are in phase and balanced in amplitude when they are applied to the discriminator.

3. The method of claim 1 further comprising the step of applying to the discriminator resonator a second magnetic field to offset the tuning frequency of the discriminator resonator from the tuning frequency of the circuit resonators.

4. The method of claim 3 wherein the reference signal is swept over a range of frequencies and the circuit resonators track the reference signal.

5. The method of claim 4 wherein the circuit is the preselector of a spectrum analyzer and the reference signal is an LO signal.

6. A tunable tracking ferrimagnetic resonator filter for filtering RF signals, comprising:
means for producing a first magnetic field $H_T$;
means for producing a second magnetic field $H_O$;
means for producing a reference frequency signal;
a plurality of ferrimagnetic resonators connected in series and located in the magnetic field $H_T$, with the initial resonator having an input port and the final resonator having an output port, for receiving an RF input signal at the input port and coupling the input signal to the output port when the frequency of the RF input signal is substantially the same as the resonance frequency produced in the ferrimagnetic resonators by the magnetic field $H_T$, to produce a filtered RF signal;
a discriminator comprising a ferrimagnetic resonator located in both the first magnetic field $H_T$ and the second magnetic field $H_O$, means for receiving the reference signal and applying the reference signal to the discriminator resonator, and means for producing an output error signal proportional to the difference between the frequency of the reference signal and the resonance frequency produced by the combined magnetic fields $H_T$ and $H_O$; and
feedback means for adjusting the means for producing the first magnetic field $H_T$ in response to the error signal from the discriminator so the resonance frequency of the plurality of ferrimagnetic resonators tracks the reference frequency.

7. The apparatus of claim 6 wherein the reference signal is an LO signal, and the final resonator operates as a mixer, having means for receiving the LO signal and having means for combining the filtered RF signal with the LO signal to produce an IF signal of frequency $f_{IF}=f_{LO}-f_{RF}$ on an output line coupled to the output port.

8. The apparatus of claim 7 wherein the final resonator further comprises a resistor and capacitor matching network connected between the output line and ground, providing a low impedance path to ground for the LO signal, and providing de-Qing of parallel resonance with a load connected to the output port.

9. The apparatus of claim 8 wherein the means for combining the filtered RF signal with the LO signal comprises a pair of diodes, and the diodes and the resistor and capacitor matching network are located on a single integrated circuit chip.

10. The apparatus of claim 6 wherein the initial resonator has an input loop and an output loop, with one side of the input loop connected to the input port and the second side of the input loop connected to a low frequency output port, and with the output loop connected to the second resonator in the series; and
further comprising a switchable means for connecting the second side of the input loop to ground via a low impedance RF path, so that when the second side of the input loop is connected to ground via the low RF impedance path, the RF input signal is coupled through the ferrimagnetic body in the resonator to the output loop, and when the second side of the input loop is not connected to ground via the low RF impedance path, the input RF signal flows out the output port.

11. The apparatus of claim 10 wherein the switchable means comprises a PIN diode switch circuit.

12. The apparatus of claim 11 wherein the PIN diode switch circuit includes a resistor connected in series with the PIN diode.

13. The apparatus of claim 10, wherein the initial resonator further comprises a resistor and capacitor matching network connected between the second end of the input loop and ground, in parallel with the low RF impedance path, providing a low-pass filter in combination with the inductance of the output port for signals of frequency below 3 GHz, providing de-Qing of parallel resonance between the capacitance of the PIN diode switch circuit and the inductance of the output port for signals with frequency from 3-10 GHz, and providing a low impedance path to ground for signals at frequencies above 10 GHz.

14. The apparatus of claim 6 wherein the discriminator produces the error signal on an error output line, and the discriminator further comprises a resistor and capacitor matching network connected between the error output line and ground, providing a low impedance path to ground for the LO signal, and providing de-Qing of parallel resonance with a load connected to the error output line.

15. The apparatus of claim 14 wherein the means for producing the error output signal comprises a pair of diodes, and the diodes and the resistor and capacitor matching network are located on a single integrated circuit chip.

16. A tunable tracking ferrimagnetic resonator filter and mixer for filtering and downconverting RF signals, comprising:
means for producing a first magnetic field $H_T$;
means for producing a second magnetic field $H_O$;
a first tunable ferrimagnetic resonator located in the magnetic field $H_T$, comprising an input loop having a first side and a second side, with the first side connected to an input port for receiving an RF input signal, an output loop orthogonal to the input loop, and a ferrimagnetic body for coupling the RF input signal from the input loop to the output loop when the frequency of the RF input signal is substantially the same as the resonance frequency produced by the magnetic field $H_T$, to produce a filtered RF signal in the output loop;

a second ferrimagnetic resonator located in the magnetic field $H_T$, comprising an input loop connected to the output loop of the first resonator, an output loop orthogonal to the input loop, and a ferrimagnetic body for coupling the filtered RF signal from the input loop to the output loop when the frequency of the filtered RF signal is substantially the same as the resonance frequency produced by the magnetic field $H_T$, to produce a twice filtered RF signal;

a third ferrimagnetic resonator located in the magnetic field $H_T$, comprising a first loop connected to the output loop of the second resonator, a second loop orthogonal to the first loop having a first side connected to an input port for receiving an LO signal and a second side connected to an output line, a ferrimagnetic body for coupling the twice filtered RF signal from the first loop to the second loop when the frequency of the filtered RF signal is substantially the same as the resonance frequency produced by the magnetic field $H_T$, and means for combining the LO signal with the RF signal to produce an IF signal of frequency $f_{IF}$ on the output line, with $f_{IF}=f_{LO}-f_{RF}$;

a fourth ferrimagnetic resonator located both in the magnetic field $H_T$ and in the magnetic field $H_O$, comprising a first loop connected to an input port for receiving the LO signal, a second loop orthogonal to the first loop and connected to the input port for receiving the LO signal, a ferrimagnetic body for coupling the LO signal in the first loop to the second loop when the frequency of the LO signal is near the resonance frequency produced by the combined magnetic fields $H_T$ and $H_O$, and for changing the phase of the coupled LO signal by an amount proportional to the difference between the frequency of the LO signal and the resonance frequency of the discriminator resonator, and means for combining the original LO signal with the phase shifted LO signal to produce an error signal indicative of the difference between the frequency of the LO signal and the resonance frequency produced by the combined magnetic fields $H_T$ and $H_O$; and feedback means for adjusting the means for producing the first magnetic field $H_T$ in response to the error signal from the fourth resonator, so that the resonance frequency of the fourth resonator produced by $H_T$ and $H_O$ is the frequency of the LO signal.

17. The apparatus of claim 16, wherein the second side of the input loop of the first resonator is connected to a low frequency output port; and further comprising a switchable means for connecting the second side of the input loop of the first resonator to ground via a low impedance RF path, so that when the second side of the input loop is connected to ground via the low RF impedance path, the RF input signal is coupled through the ferrimagnetic body in the first resonator to the output loop, and when the second side of the input loop is not connected to ground via the low RF impedance path, the input RF signal flows out the output port.

18. The apparatus of claim 17 wherein the switchable means comprises a PIN diode switch circuit.

19. The apparatus of claim 18 wherein the PIN diode switch circuit includes a resistor connected in series with the PIN diode.

20. The apparatus of claim 16, further comprising a resistor and capacitor matching network connected between the second end of the input loop of the first resonator and ground, in parallel with the low RF impedance path, providing a low-pass filter in combination with the inductance of the output port for signals of frequency below 3 GHz, providing de-Qing of parallel resonance between the capacitance of the PIN diode switch circuit and the inductance of the output port for signals with frequency from 3–10 GHz, and providing a low impedance path to ground for signals at frequencies above 10 GHz.

21. The apparatus of claim 16 wherein the third resonator further comprises a resistor and capacitor matching network connected between the output line and ground, providing a low impedance path to ground for the LO signal, and providing de-Qing of parallel resonance with a load connected to the output port.

22. The apparatus of claim 21 wherein the means for combining the filtered RF signal with the LO signal comprises a pair of diodes, and the diodes and the resistor and capacitor matching network are located on a single integrated circuit chip.

23. The apparatus of claim 16 wherein the fourth resonator produces the error signal on an error output line, and the fourth resonator further comprises a resistor and capacitor matching network connected between the error output line and ground, providing a low impedance path to ground for the LO signal, and providing de-Qing of parallel resonance with a load connected to the error output line.

24. The apparatus of claim 23 wherein the means for producing the error output signal comprises a pair of diodes, and the diodes and the resistor and capacitor matching network are located on a single integrated circuit chip.

25. A tracking ferrimagnetic tuned resonator circuit, comprising:

means for producing a magnetic field $H_T$;

means for producing a reference frequency signal;

a ferrimagnetic tuned resonator circuit comprising at least one ferrimagnetic resonator located in the magnetic field $H_T$, the at least one ferrimagnetic resonator having an input port and an output port, for receiving an RF input signal at the input port and coupling the input signal to the output port when the frequency of the RF input signal is substantially the same as the resonance frequency produced in the ferrimagnetic resonator by the magnetic field $H_T$;

a discriminator comprising a ferrimagnetic resonator located in the magnetic field $H_T$, means for receiving the reference signal and applying the reference signal to the discriminator resonator, and means for producing an output error signal proportional to the difference between the frequency of the reference signal and the resonance frequency of the discriminator resonator produced by the magnetic field $H_T$; and feedback means for adjusting the means for producing the magnetic field $H_T$ in response to the error signal from the discriminator so the resonance frequency of the at least one ferrimagnetic resonator in the ferrimagnetic tuned resonator circuit tracks the reference frequency.

* * * * *

UNITED STATES PATENT AND TRADEMARK OFFICE
CERTIFICATE OF CORRECTION

PATENT NO. : 4,817,200

DATED : March 28, 1989

INVENTOR(S) : Hassan Tanbakuchi

It is certified that error appears in the above-identified patent and that said Letters Patent is hereby corrected as shown below:

Line 15 of the Abstract, "discrimintor" should read -- discriminator --;

Lines 21-22 of the Abstract, "comprises" should read -- comprise --;

Column 5, Line 19, "input line 309 HT or output line" should read -- input line 309 or output line --; and

Signed and Sealed this
Seventh Day of November, 1989

Attest:

JEFFREY M. SAMUELS

Attesting Officer     Acting Commissioner of Patents and Trademarks